(12) United States Patent
Hayasaki et al.

(10) Patent No.: US 7,384,696 B2
(45) Date of Patent: Jun. 10, 2008

(54) CORROSION RESISTANT MEMBER AND METHOD FOR MANUFACTURING THE SAME

(75) Inventors: Tetsuji Hayasaki, Kokubu (JP); Masahiro Nakahara, Kokubu (JP)

(73) Assignee: Kyocera Corporation, Kyoto (JP)

( * ) Notice: Subject to any disclaimer, the term of this patent is extended or adjusted under 35 U.S.C. 154(b) by 372 days.

(21) Appl. No.: 11/194,126

(22) Filed: Jul. 28, 2005

(65) Prior Publication Data

US 2005/0282034 A1  Dec. 22, 2005

(30) Foreign Application Priority Data

Oct. 26, 2004 (JP) .................. P2004-310859

(51) Int. Cl.
*B32B 15/04* (2006.01)
*B32B 18/00* (2006.01)
*B32B 9/00* (2006.01)

(52) U.S. Cl. ............... 428/469; 428/701; 428/702

(58) Field of Classification Search ............... 428/469, 428/699, 700, 701, 702
See application file for complete search history.

(56) References Cited

U.S. PATENT DOCUMENTS

| 6,188,176 | B1 * | 2/2001 | Nakaya et al. ............ 313/504 |
| 6,617,056 | B1 * | 9/2003 | Hara et al. ................. 428/697 |
| 6,783,875 | B2 | 8/2004 | Yamada et al. |
| 6,912,031 | B2 * | 6/2005 | Ohnishi ...................... 349/123 |
| 7,164,459 | B2 * | 1/2007 | Ohnishi ...................... 349/123 |
| 7,294,852 | B2 * | 11/2007 | Wakairo et al. ............ 257/43 |
| 7,309,531 | B2 * | 12/2007 | Suzuki et al. .............. 428/690 |
| 2001/0003271 | A1 | 6/2001 | Otsuki |
| 2003/0200929 | A1 | 10/2003 | Otsuki |

FOREIGN PATENT DOCUMENTS

| JP | 2000-355752 | 12/2000 |
| JP | 2001-131730 | 5/2001 |
| JP | 2001-152307 | 6/2001 |
| JP | 2001-152308 | 6/2001 |
| JP | 2001-226773 | 8/2001 |
| JP | 2002-249864 | 9/2002 |
| JP | 2003-328107 | 11/2003 |

* cited by examiner

*Primary Examiner*—John J. Zimmerman
*Assistant Examiner*—Aaron Austin
(74) *Attorney, Agent, or Firm*—Hogan & Hartson LLP

(57) ABSTRACT

A corrosion resistant member comprising a base material made of ceramics or a metal and at least one layer of corrosion resistant film formed on the surface of the former. At least one layer of the corrosion resistant film is a corrosion resistant film formed from a compound of the group 3 element as the main component and has specific characteristics so that it can improve film property.

8 Claims, 4 Drawing Sheets

CORROSION RESISTANT MEMBER AND METHOD FOR MANUFACTURING THE SAME

BACKGROUND OF THE INVENTION

1. Field of the Invention

The present invention relates to various members used in semiconductor manufacturing equipment and liquid crystal manufacturing equipment, particularly to component parts of etching apparatus, CVD apparatus or the like such as inner wall material (chamber), microwave introducing window, shower head, focus ring and shield ring, component parts of cryopump, turbo molecular pump or the like used in such equipment to achieve a high degree of vacuum and, especially among these, parts that are required to have high corrosion resistance against corrosive gases and plasma thereof.

2. Description of the Related Art

Quartz and sintered aluminum oxide have been commonly used for making members of semiconductor manufacturing equipment and liquid crystal manufacturing equipment that are exposed to plasma in corrosive halogen gas atmosphere including fluorine and/or chlorine, such as inner wall material of vacuum chamber, microwave introducing window, focus ring and susceptor.

In recent years, however, it has been proposed to coat the surface exposed to plasma in corrosive halogen gas atmosphere including fluorine and/or chlorine with an oxide or a flouride of a compound of the group 3 element for making a member that has high resistance against corrosion, instead of quartz and sintered aluminum oxide.

More recently, it has been proposed to use the conventionally employed material as the base material and form a corrosion resistant coating or a corrosion resistant layer thereon thereby to make use of the properties of the conventionally employed material and improve the corrosion resistance thereof, rather than forming the entire member that is exposed to corrosive halogen gas atmosphere including fluorine and/or chlorine from a corrosion resistant material.

As the method for forming the corrosion resistant coating or the corrosion resistant layer described above, thermal spraying method has been dominantly employed. In the thermal spraying method, a material having higher corrosion resistance than the base material, that is melted by means of a heat source such as plasma, is sprayed from a nozzle in the form of fine particles and is caused to deposit and solidify on the surface of a base material made of ceramics or a metal, so as to form the corrosion resistant coating or the corrosion resistant layer.

As an apparatus that uses a corrosion resistant coating or the corrosion resistant layer formed by the thermal spraying method, such a processing apparatus is disclosed that comprises a processing vessel containing a substrate to be processed in the manufacture of semiconductor, and a processing mechanism for processing the substrate in the processing vessel, wherein the processing vessel is lined with a coating containing a compound of the group 3 element of the periodic table, on the inner surface thereof, and the coating is formed by the thermal spraying method (see Japanese Unexamined Patent Publication (Kokai) No. 2001-226773).

Also disclosed is a member resistant to halogen gas plasma that is exposed to the plasma of halogen gas, comprising a main body and a corrosion resistant film formed on at least the surface of the main body, wherein the corrosion resistant film that is formed by thermal spraying method adheres to the main body with peel-off strength of 15 MPa, and is subjected to a heat treatment at a temperature from 1400 to 1600° C. in order to make the film denser (see Japanese Un examined Patent Publication (Kokai) No. 2002-249864).

Moreover, it is disclosed that an complex oxide ceramics material is formed by thermal spraying of a plurality or amorphous material at a temperature of 800° C. or higher and lower than the eutectic temperature of the component, thereby to precipitate crystal particles of a plurality of kinds measuring from 10 nm to 10 μm across (see Japanese Unexamined Patent Publication (Kokai) No. 2003-328107).

Also thermally sprayed film and member having the thermally sprayed film have been disclosed developed for improving the adhesion of the thermally sprayed film to the base material, strength, corrosion resistance, wear resistance and/or durability of the thermally sprayed film by mixing various materials and using the composite material in the thermal spraying method, or by filling pores of the thermally sprayed film formed on the base material made of a metal or other material with a filler thereby to make the thermally sprayed film denser (see Japanese Unexamined Patent Publication No. 2000-355752, Japanese Unexamined Patent Publication (Kokai) No. 2001-131730, Japanese Unexamined Patent Publication (Kokai) No. 2001-152307, Japanese Unexamined Patent Publication (Kokai) No. 2001-152308).

For the corrosion resistant film described above, PVD corrosion resistant films formed by various variations of PVD method that enable it to obtain corrosion resistant films that is denser than the thermally sprayed film have been employed in addition to those formed by the thermal spray method (see Japanese Unexamined Patent Publication (Kokai) No. 10-4083).

SUMMARY OF THE INVENTION

It is in object of the present invention to provide a corrosion resistant member which improves corrosion resistance or other properties such as particle generation.

According to the first aspect of the invention, a corrosion resistant member comprises: (a) a base material including ceramics or a metal and (b) at least one layer of corrosion resistant film formed on the surface of said base material, wherein at least one layer of said corrosion resistant film is a PVD corrosion resistant film formed from a group 3 element compound as the main component, and said PVD corrosion resistant film has a value of ratio $I_{400}/I_{222}$ of peak intensity $I_{400}$ assignable to (400) plane to peak intensity $I_{222}$ assignable to (222) plane of X-ray diffraction not higher than 0.5.

Such corrosion resistance member can suppress the crystal orientation when the corrosion resistant film is formed, and can decrease the residual stress in the film. Thus it is made possible to prevent the film from cracking or breaking due to the residual stress generated in the film during and after forming the film. When the crystal structure is mainly oriented to (222) plane, the film is less likely to crack or break when the film surface is subjected to an external impact, compared with a film of which crystal structure oriented to (400) plane. Therefore, corrosion resistant member that has satisfactory durability is provided.

According to the second aspect of the invention, a corrosion resistant member comprises: (a) a base material comprising ceramics or a metal and (b) at least one layer of corrosion resistant film formed on the surface of said base material, wherein at least one layer of said corrosion resistant film is a thermally sprayed corrosion resistant film that is formed from a compound of the group 3 element as the main component, and said thermally sprayed corrosion resistant film contains at least one of Ti, Al and Si at 0.001 to 3% by weight on oxide basis and has a mean crystal particle size in a range from 0.5 to 10 μm.

Such corrosion resistant member can suppress the precipitation of large crystal grains to the surface of the corrosion resistant film, and can form crystal grains of size that is favorable for achieving the anchoring effect on the surface of the member when the products of reaction with corrosive gas or plasma thereof stick onto the surface of the corrosion resistant film, as well as increase the density of the corrosion resistant film and improve the corrosion resistance of the member.

According to the third aspect of the present invention, A corrosion resistant member comprises: (a) a base material including ceramics or a metal and (b) at least two layers of corrosion resistant film formed on the surface of said base material, wherein said corrosion resistant film comprises (i) a thermally sprayed corrosion resistant film that is formed from a compound of the group 3 element as the main component, contains 0.001 to 3% by weight on oxide basis of at least one of Ti, Al and Si, and has a mean crystal particle size in a range from 0.5 to 10 μm, and (ii) a PVD corrosion resistant film that is formed from a compound of the group 3 element as the main component and has a value of ratio $I_{400}/I_{222}$ of peak intensity $I_{400}$ assignable to (400) plane to peak intensity $I_{222}$ assignable to (222) plane of X-ray diffraction not higher than 0.5.

Such corrosion resistant member has advantages and compensates drawbacks of a thermally sprayed corrosion resistant film, which has a relatively large number of voids through which the corrosive gas used in the semiconductor manufacturing process passes but is sufficiently thick, and PVD corrosion resistant film, which is dense enough to prevent permeation of the corrosive gas but cannot be formed in a thick film.

In the case where the thermally sprayed corrosion resistant film is formed on the base material and the PVD corrosion resistant film is formed thereon, the surface of the film will be so dense that corrosive gas is prevented from passing through. Therefore, such corrosion resistant member is preferably used as members of semiconductor manufacturing equipment that are exposed to plasma and subjected to relatively rapid corrosion, such as shower head, focus ring, shield ring and susceptor.

On the other hand, in the case where the PVD corrosion resistant film and the thermally sprayed corrosion resistant film are formed on the base material in this order, the corrosion resistant member has a surface made of the rough thermally sprayed corrosion resistant film. Therefore, particles generated when forming the film in the semiconductor manufacturing process can be fixed on the rough surface of the thermally sprayed corrosion resistant film by the anchoring effect and can be prevented from coming off. As a result, the corrosion resistant member demonstrates better properties when used in peripheral members (chamber, microwave introducing window) whereon the particulate matter generated when forming the film tends to stick.

DESCRIPTION OF THE PREFERRED EMBODIMENTS

Figure 1A:
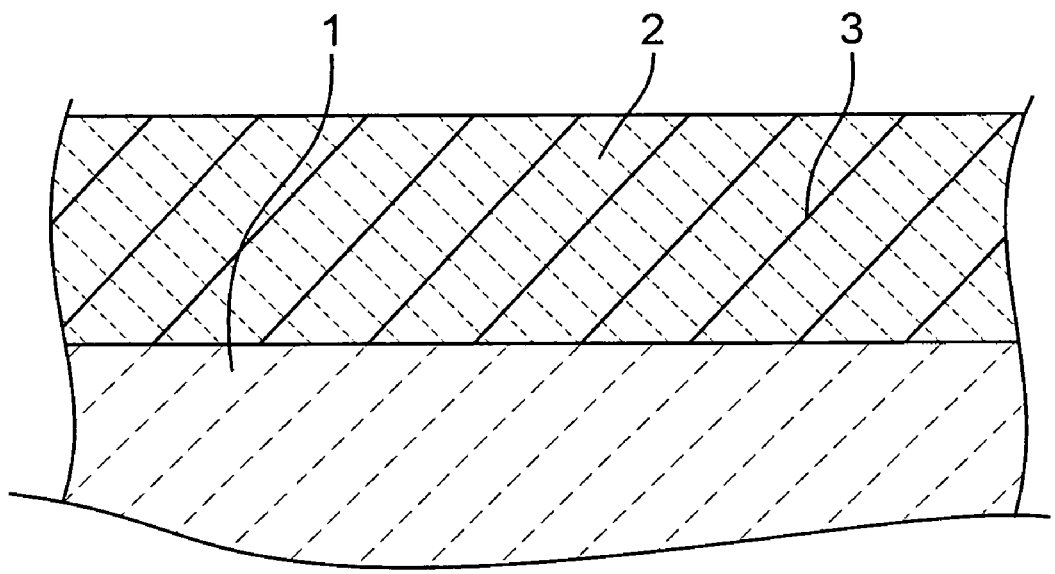
FIG. 1A and FIG. 1B are a section view of the crystal structure of the corrosion resistant film of the corrosion resistant member according to the present invention, FIG. 1A showing a case of crystal oriented to (222) plane and FIG. 1B showing a case of crystal oriented to (400) plane.

The a plication is based on applications Nos. 2004-22271 and 2004-310859 filed in Japan, the content of which is incorporated herein by reference.

The corrosion resistant member comprises a base material made of ceramics or a metal and at least one layer of corrosion resistant film formed on the surface of the base material, and is particularly used as a member resistant to plasma in semiconductor manufacturing equipment that is required to have corrosion resistance against gases that contain fluorine and/or chlorine and plasma thereof. Gases that contain fluorine and/or chlorine include fluorides such as $SF_6$, $CF_4$, $CHF_3$, $ClF_3$, $NF_3$, $C_4F_8$ and HF, chlorine and chlorides such as $Cl_2$, HCl, $BCl_2$ and $CCl_4$ and bromine and bromides such as $Br_2$, HBr and $BBr_3$. When such a corrosive gas is exposed to microwave or high frequency radiation under a pressure of 1 to 10 Pa, the gas is turned into plasma that makes contact with the members of the semiconductor manufacturing equipment. Moreover, in order to achieve higher effect of etching, an inert gas such as Ar may be introduced along with the corrosive gas, and plasma thereof may be generated.

Since the base material is made of ceramics or a metal and has the corrosion resistant film formed thereon, it can be used to manufacture a corrosion resistant member that demonstrates the properties of the base material suitable for the application. For the ceramics described above, alumina, silicon nitride, silicon carbide, zirconia, YAG (yttrium aluminum garnet) or the like may be used. For the metal, stainless steel, alloy tool steel, carbon tool steel, chromium-alloy steel, aluminum, chromium-molybdenum steel, nickel-chromium-molybdenum steel or the like.

It is preferable to use a ceramic material such as alumina, silicon nitride, silicon carbide for the base material. Alumina is commonly used in a wide range of applications, and its low cost allows it to be used in the inner wall that has the largest area of contact with the corrosive gas in the semiconductor manufacturing equipment. In the member of the semiconductor manufacturing equipment, silicon nitride is used as a high-strength material, and silicon carbide is used as a high-heat conductivity material. When the surface of such a member is coated with the corrosion resistant film, the corrosion resistant member has improved resistant to corrosive gases containing fluoride and/or chloride, making advantage of the properties of the component materials.

In case the base material is made of ceramics, it preferably has relative density of 95% or higher, so that higher corrosion resistance is provided by the corrosion resistant film while preserving the electrical and mechanical properties of the base material. The base material having a relative density lower than 95% cannot demonstrate the intrinsic electrical and mechanical properties of the material.

The base material has at least one layer of corrosion resistant film formed on the surface thereof. Various forms of corrosion resistant film will now be described by way of first through third embodiments.

Embodiment 1

The first embodiment is the corrosion resistant member having at least one layer of PVD corrosion resistant film formed on the surface of the base material.

The corrosion resistant member has the corrosion resistant film formed on the surface thereof of which at least one layer contains a compound of the group 3 element as the main component, and has a value of ratio $I_{400}/I_{222}$ of peak intensity $I_{400}$ assignable to (400) plane to peak intensity $I_{222}$ assignable to (222) plans of X-ray diffraction being 0.5 or less.

The value of ratio $I_{400}/I_{222}$ is set to 0.5 or less, in order to make a film structure that is durable against the stress generated in the surface and inside during and after formation of the PVD corrosion resistant film. The PVD corrosion resistant film has the crystal oriented to (222) plane or (400) plane as identified by X-ray diffraction analysis after the film has been formed.

Figure 1B:
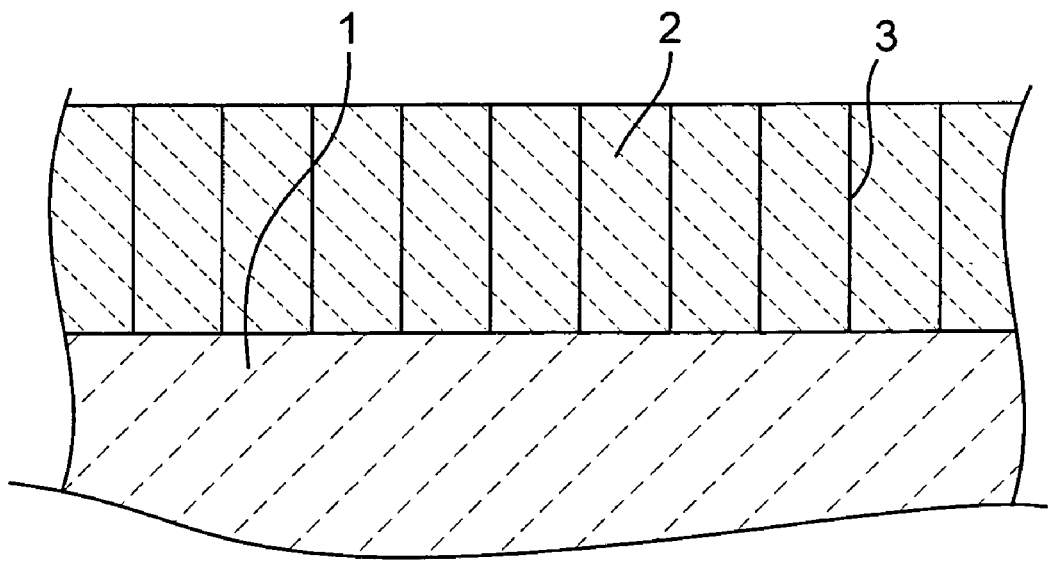

FIG. 1A is a schematic sectional view of the crystal structure of the PVD corrosion resistant film used in the corrosion resistant member of the present invention, where the crystal is oriented (222) plane and FIG. 1B is a schematic sectional view of a case where the crystal is oriented to (400) plane. As shown in FIG. 1, crystal 2 is oriented at an angle of about 45 degrees from the base material 1 in 2-dimensional view, when the crystal is oriented to (222) plane. When the crystal is oriented to (400) plane, crystal 2 is oriented at right angles to the base material 1. Therefore, in FIG. 1A, when stress is applied to the base material 1 in a direction at right angles thereto, the film is less likely to crack or break because the stress is dispersed in a direction 45 degrees from the direction perpendicular to the base material in crystal grain boundary 3 that is particularly susceptible to cracking and breaking. In the case shown in FIG. 1B, in contrast, the corrosion resistant film 2 is likely to crack or break since stress is concentrated in the crystal grain boundary 3 when stress is applied to the surface of the corrosion resistant film. The same can be said for the residual stress generated in the corrosion resistant film 2 when forming the film, and the corrosion resistant film 2 is less likely to crack or break when the crystal is oriented to (222) plane.

By orienting the crystal to (222) plane, the film is made more durable to the residual stress of the corrosion resistant film and to the stress applied from the outside. Thus a corrosion resistant film formed so as to have a value or ratio $I_{400}/I_{222}$ of peak intensity $I_{400}$ assignable to (400) plane to peak intensity $I_{222}$ assignable to (222) plane of X-ray diffraction being 0.5 or less by making a majority of the crystal oriented to (222) plane is more durable to the internal stress and the external stress. It is preferable to set the ratio $I_{400}/I_{222}$ to 0.3 or less. It is most preferable to set the ratio to 0.1 or less, so that most of the crystal is oriented to (222) plane.

Figure 2A:
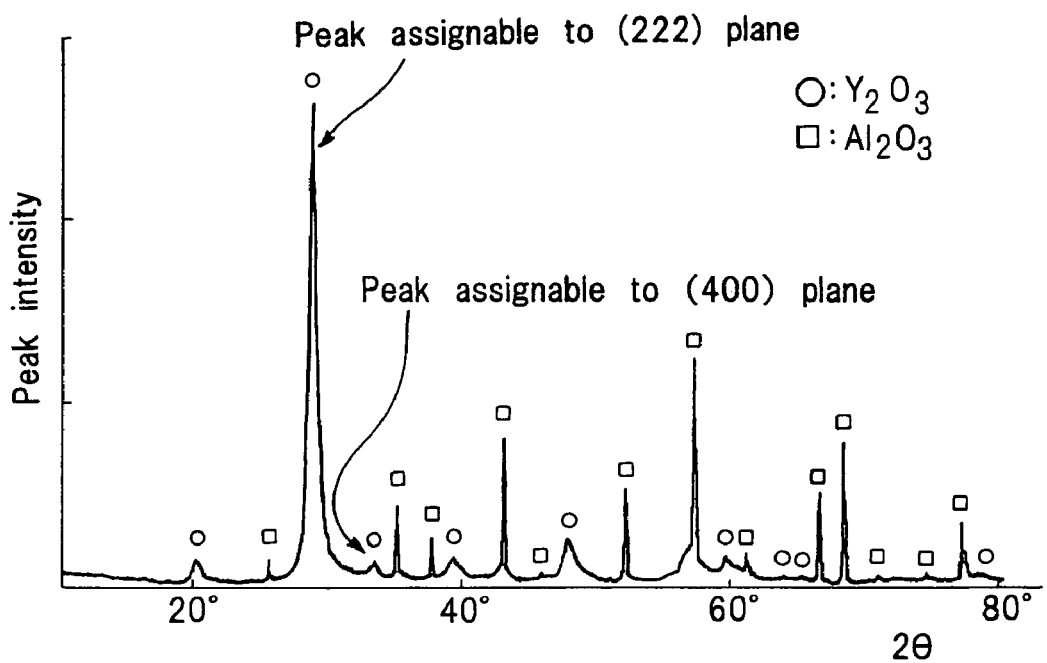
FIG. 2A is an X-ray diffraction chart of the corrosion resistant film of the corrosion resistant member according to the present invention.
Figure 2B:
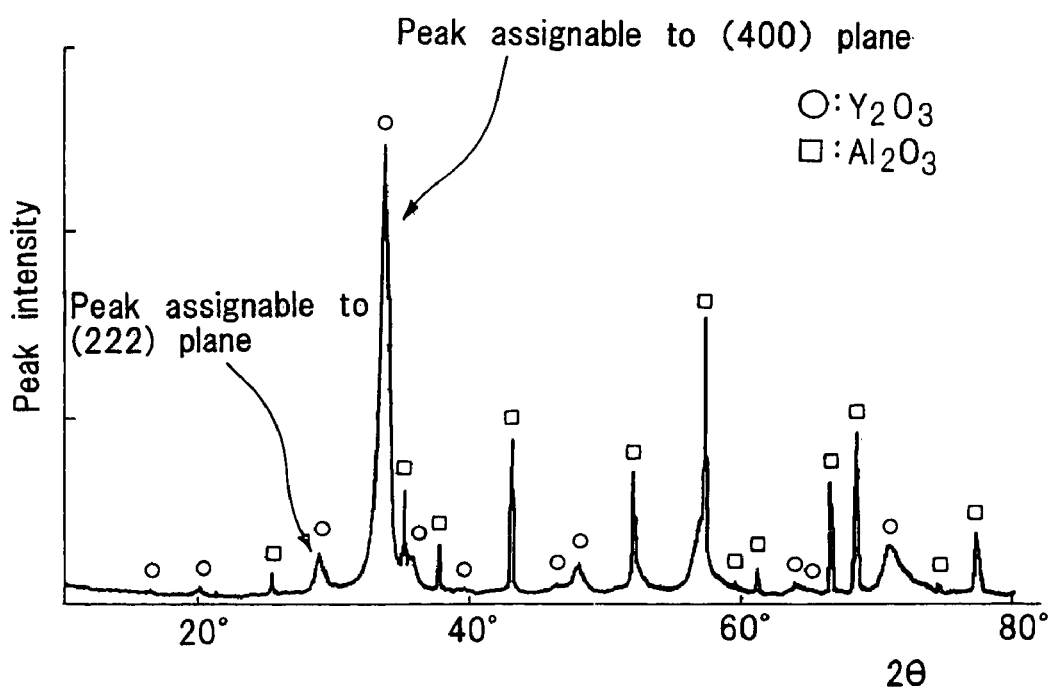
FIG. 2B is an X-ray diffraction chart of corrosion resistant film of the corrosion resistant member of THE comparative example.

FIG. 2 is an X-ray diffraction chart measured with an X-ray diffraction instrument on the surface of the PVD corrosion resistant film, in the corrosion resistant member made by forming the PVD corrosion resistant film of a predetermined thickness on the base material 1 made of oxide aluminum. In the chart, ⊔ indicates the diffraction peak of yttrium oxide having cubic crystal structure, and □ indicates the diffraction peak of aluminum oxide that makes the base material. As can be seen from the results of X-ray diffraction analysis, FIG. 2A shows a value of about 0.1, that is lower than 0.5 for the ratio $I_{400}/I_{222}$ of peak intensity $I_{400}$ assignable to (400) plane to peak intensity $I_{222}$ assignable to (222) plane of X-ray diffraction. FIG. 2D, in contrast, shows values of the ratio $I_{400}/I_{222}$ or higher, in which case the peak assignable to (400) plane has a very high intensity and the film experienced crack developing from the surface to the inside due to residual stress generated in the PVD corrosion resistant film when it was formed.

As to peaks other than those assignable to (222) plane or (400) plane, such a crystal orientation as the peak intensity is not higher than 50% of the intensity of the peak assignable to (222) plane does not cause the PVD corrosion resistant film to experience crack or breakage that is attributable to internal stress.

When the PVD corrosion resistant film has a value of ratio $I_{400}/I_{222}$ higher than 0.5 and lower than 1, and peak intensity assignable to (600) plane and peak intensity assignable to (800) plane are in a range from 2 to 20% of the peak intensity assignable to (222) plane, then the PVD corrosion resistant film having similar level of corrosion resistance, though with lower strength or adhesion to the base material, can be made at a lower cost compared to a case of the PVD corrosion resistant film having ratio $I_{400}/I_{222}$ of 0.5 or lower.

The mechanism or the strength of adhesion of the PVD corrosion resistant film decreasing when the ratio $I_{400}/I_{222}$ is higher than 0.5 and lower than 1 is presumably that the collision speed of the ions of the corrosion resistant film component impinging on the base material decreases, since the ions of the corrosion resistant film component are driven with lower power when ion plating method is employed in forming the PVD corrosion resistant film, while details will be described later. When peak intensity assignable to (600) plane and peak intensity assignable to (800) plane as measured by X-ray diffraction are in a range from 2 to 20% of the peak intensity assignable to (222) plane, however, corrosion resistance of substantially the same level can be maintained since the film has a crystal orientation different from that of the corrosion resistant film that has the ratio $I_{400}/I_{222}$ of 0.5 or lower. It can also be manufactured at a lower cost than the PVD corrosion resistant film having ratio $I_{400}/I_{222}$ of 0.5 or lower, thus making it applicable to such members of semiconductor manufacturing equipment that are not required to have mechanical strength, such as the shower head, the focus ring, inner circumference and side face of the shield ring, and fixtures used in the chamber. When compared to the PVD corrosion resistant film having ratio $I_{400}/I_{222}$ of 0.5 or lower, decrease in the bonding strength is less than 50%.

A PVD corrosion resistant film having a value of ratio $I_{400}/I_{222}$ of 0.5 or lower has peak intensity assignable to (600) plane and peak intensity assignable to (800) plane that are less than 2% of the peak intensity assignable to (222) plane and are difficult or impossible to observe. The PVD corrosion resistant film having ratio $I_{400}/I_{222}$ of 0.5 or lower can be preferably used in members having relatively small wall thickness such as focus ring and shield ring, since a high bias is required to drive the ions when ion plating method is employed to form the PVD corrosion resistant film. A PVD corrosion resistant film having a value of ratio $I_{400}/I_{222}$ higher than 0.5 and lower than 1 and peak intensity assignable to (600) plane and peak intensity assignable to (800) plane that are in a range from 2 to 20% of the peak intensity assignable to (222) plane, in contrast, can be preferably used in members having large wall thickness such as shower head and inner wall of chamber, since the film is not susceptible to crack or breakage even when the bias is low, although strength of bonding to the base material is lower.

The peak intensity can be measured with a thin film X-ray diffractometer by projecting X-ray at a low angle, that can be from 1 to 2 degrees.

Among the compounds of the group 3 elements, $Y_2O_3$ is preferably used to form the corrosion resistant film, because $Y_2O_3$ is particularly common and available at a low cost among the compounds of the group 3 elements, and has high corrosion resistance to endure corrosive halogen gas atmosphere containing fluorine and/or chlorine and plasma thereof.

Inert gas component such as Ar, Ne and Kr contained in the PVD corrosion resistant film is preferably 0.1% by volume or less.

The inert gas component is the inert gas used in the PVD process to form the PVD corrosion resistant film, and is trapped in the PVD corrosion resistant film. When the inert gas content is set to 0.1% by volume or less, vacuum level in the chamber does not decrease and the corrosion resistance against corrosive halogen gas and plasma thereof is not much affected, even when the film is corroded and the inert gas component is released from the corrosion resistant film, in case the corrosion resistant member having the PVD corrosion resistant film of the present invention is used as the inner wall of chamber of semiconductor manufacturing equipment. It is more preferable to keep the inert gas content to 0.05% by volume or less.

The inert gas contest contained in the PVD corrosion resistant film can be set to 0.1% by volume or less, by properly controlling the period of time during which the base material surface whereon the PVD corrosion resistant film is to be formed is irradiated with the ions of inert gas in order to clean the surface and achieve surface reformation by activation, which will be described in detail later. The inert gas content can be quantitatively measured by means of gas chromatography or the like.

The PVD corrosion resistant film preferably has arithmetic mean roughness (Ra) of 1 μm or less. By making the surface smoother, surface area that is exposed to the corrosive gas and plasma thereof is made smaller, so that high corrosion resistance can be maintained over a long period of time. Surface roughness can be measured with a commercially available surface roughness meter according to JIS B0601.

The mean crystal particle size of the PVD corrosion resistant film is preferably in a range from 50 nm to 1000 nm inclusive, which makes it possible to form the corrosion resistant film that is predominantly oriented to (222) plane, as described previously. Although no explanation has been given to this mechanism, the corrosion resistant film becomes increasingly oriented to (400) plane leading to cracks in the film surface after the corrosion resistant film is formed, when the mean crystal particle size is out of this range.

Uniform and dense film can be obtained at a low cost when thickness of the PVD corrosion resistant film is in a range from 1 to 100 μm. The corrosion resistant film thinner than 1 μm has a short life. The corrosion resistant film thicker than 100 μm requires it to form a number of thin films formed one on another in the case of PVD method, resulting in a higher manufacturing cost. Thus the film thickness is preferably in the range described above.

The PVD corrosion resistant film has relative density of preferably 70% or higher. Density lower than 70% leads to significantly low corrosion resistance. Relative density of the PVD corrosion resistant film may be calculated from the measurement of X-ray reflectivity. Relative density is more preferably 95% or higher.

The bonding strength of the PVD corrosion resistant film with the base material is 10 gf or higher in terms of durable load measured by a scratch tester that is commonly used to test the bonding strength of films.

The scratch tester detects peel-off of a film by measuring a voltage that represents the difference between frictional force and restoring force generated at the tip of the tester as the tester vibrates. Commercially available testers can measure the durable load before the film peels off.

The method of forming the PVD corrosion resistant film will now be described.

The PVD corrosion resistant film is formed by a physical vapor deposition (PVD) process such as ion plating, sputtering or ion beam sputtering. Among these, ion plating method is preferably employed since it can increase the film forming rate and form a denser PVD corrosion resistant film. An example of forming the PVD corrosion resistant film by the ion plating method will be described below.

The base material is heat-treated at a temperature from 300 to 1000° C. This is for the purpose of remove organic matter from the base material surface, thereby to prevent the PVD corrosion resistant film from peeling off due to gasification of the organic matter in the interface between the corrosion resistant film and the base material during the process. Cleaning will ultraviolet (UV) ray is also effective to remove the organic matter from the base material surface. Instead of the heat treatment described above, cleaning with a chemical solution may also be employed to remove the organic matter and metallic contamination from the base material surface.

The method of forming the PVD corrosion resistant film by means of an ion plating apparatus 11 shown in FIG. 4 will now be described.

Before forming the PVD corrosion resistant film by vapor deposition, the atmosphere in the vacuum unit vessel 12 is conditioned. For example, after introducing argon gas into the vacuum vessel 12 to achieve a level of vacuum of $4\times10^{-2}$ Pa, glow discharge is effected. Then after introducing $O_2$ gas for oxidization into the vacuum vessel 12 to achieve about $1.2\times10^{-1}$ Pa in the level of vacuum, the base material is bombarded with ionized $Y_2O_3$ as the evaporation material 14 so as to deposit thereon and form the film to the predetermined thickness at a rate of about 0.5 nm/sec. By heating an evaporation source 15 with a filament 16 by means of an evaporation power source 18 of the ion plating apparatus 11.

In order to form the PVD corrosion resistant film having the ratio $I_{400}/I_{222}$ of 0.5 or less as in the present invention, it is preferable to increase the discharge output power of the evaporation power source 18 for heating the evaporation source to 70% or higher. With an output power less than 70%, only a small amount of the film component of the evaporation source 15 is ionized, resulting in lower film density and fine cracks or breakage of the film, while the bonding strength of the film with the base material may also decrease.

In order to obtain a PVD corrosion resistant film that has a value of the ratio $I_{400}/I_{222}$ higher than 0.5 and lower than 1 and shows peak intensity assignable to (600) plane and peak intensity assignable to (800) plane which are in a range from 2 to 20% of the peak intensity assignable to (222) plane, the bias is decreased in addition to the discharge output power.

While $Y_2O_3$ powder may be used as the evaporation material 14, it is preferable to use sintered $Y_2O_3$ according to the present invention. The corrosion resistant film formed by using sintered $Y_2O_3$ has much of the crystal thereof oriented to (222) plane and is therefore durable against stress generated inside of the film and in the surface. Crystal dominantly oriented to (222) plane can be formed by using the sintered $Y_2O_3$ as the evaporation material 14, because higher energy must be imparted to evaporate the evaporation material and the evaporation material (ion) naturally has higher activation energy and forms the film on the base material surface. Forming a film having crystal orientation requires energy, and it is thought that high activation energy enables it to form crystal oriented to (222) plane, although details are not yet known. It is also made possible to increase the bonding strength of the film with the base material by forming the corrosion resistant film by the ion plating method using the sintered $Y_2O_3$.

By using the sintered $Y_2O_3$ as the evaporation material 14, not only the proportion of crystal oriented to (222) plane can be increased but also the mean crystal particle size of the PVD corrosion resistant film thus formed can be controlled within a range from 50 to 1000 nm The reason why crystal particle sizes in this range can be obtained is not known. While small crystal particles of 50 nm or less are formed when $Y_2O_3$ powder is used, favorable corrosion resistant film that is free of cracks can be formed when the crystal is grown to larger crystal particles in the range from 50 to 1000 nm.

In the ion plating method, a plasma source for the discharge of argon gas is used to generate glow discharge of 300 W using the plasma generation power source 17 in the vacuum vessel 12, so as to generate plasma of which $Ar^+$ is caused to collide with the evaporation material $Y_2O_3$, decomposed $Y_2O_3$ and $O_2$ gas, thereby ionizing or activating these materials. Negative bias voltage of about 10 V is applied to the corrosion resistant member so as to cause the $Y_2O_3$ deposit on the surface. Nitrogen, oxygen or the like may also be used instead of argon as the gas for generating the plasma.

Since the PVD corrosion resistant film is formed at a low temperature of 300 to 500° C. in the ion plating process described above, the thermally sprayed corrosion resistant film that has been formed earlier on the base material will never be melted again, and the effect of the difference in thermal expansion coefficient between the materials can be suppressed so as to crystallize most or preferably all of the corrosion resistant film surface so as to have a high density, thereby to improve the corrosion resistance further. The PVD corrosion resistant film is formed by ionizing the evaporation particles in the vacuum chamber and accelerating the ionized particles so as to collide with the negatively charged corrosion resistant member. Accordingly, the particles can be caused to firmly deposit on the base material thereby to form a dense corrosion resistant film and reduce the impurity in the corrosion resistant film.

While the plasma process that forms the corrosion resistant film in plasma has been described, high frequency excitation method where the corrosion resistant film component is ionized by high frequency power may also be employed as the method of manufacturing the PVD corrosion resistant film of the present invention.

The PVD corrosion resistant film formed as described above is dense enough, but can be grown only into a thin film. In order to form a thick corrosion resistant film, therefore, it is preferable to place a plurality of layers one on another.

Embodiment 2

The second embodiment of the present invention will now be described, where the thermally sprayed corrosion resistant film is formed by thermal spray of at least one layer on the surface of the base material.

The corrosion resistant member is characterized in that at least one layer of the corrosion resistant film is thermally sprayed corrosion resistant film that contains a compound of the group 3 element as the main component, contains 0.001 to 3% by weight on oxide basis of at least one of Ti, Al and Si, and has a mean crystal particle size in a range from 0.5 to 10 µm.

It is particularly important that mean crystal particle size of the thermally sprayed corrosion resistant film is in a range from 0.5 to 10 µm. Since the thermal spraying method forms the film by accelerating a molten material in the form of fine particles so as to collide with the surface of the base material thereby to solidify and deposit thereon, there inevitably occurs a gap between the deposited particles, resulting in a film that is not sufficiently dense. Moreover, since the material deposited on the base material rapidly cools down from the molten state of high temperature after thermal spraying, the deposited film includes a multitude of fine cracks caused by thermal shock. When this material is used in this state as the corrosion resistant member of semiconductor manufacturing equipment, for example, corrosive gas such as fluoride or chloride infiltrates into the film through the gaps between crystal grains or the fine cracks, thus increasing the surface area that is exposed to the plasma, thereby lowering the corrosion resistance of the film, and eventually eroding the base material. Further, the junction between the deposited grains may be eroded resulting in the grains falling off and, in the worst case, the entire corrosion resistant film may peel off.

Such a failure can be prevented from occurring by making the film denser and applying a heat treatment to the thermally sprayed film in order to eliminate the fine cracks in the grains. The thermal spray method melts the material of the thermally sprayed corrosion resistant film and sprays the molten material in the form of fine particles so as to collide, deposit and solidify on the base material thereby to form the thermally sprayed film of the predetermined thickness. This film is turned into the thermally sprayed corrosion resistant film through heat treatment.

The mean crystal particle size of the thermally sprayed corrosion resistant film is set in the range described above, because when the size of the crystal grains precipitated onto the surface of the thermally sprayed corrosion resistant film through heat treatment is not larger than 0.5 µm, voids and cracks formed in the thermally sprayed corrosion resistant film when the film is formed by thermal spraying cannot be filled in by the grains of the thermally sprayed corrosion resistant film that are not sufficiently grown, thus resulting in low corrosion resistance. Crystal grains larger than 10 µm, on the other hand, have grown enough to fill in the voids, but deposition of the grains that have grown too large on the surface of the thermally sprayed corrosion resistant film results in significant undulation of the surface. In this case, when products of reaction with the corrosive gas or plasma thereof stick onto the surface of the thermally sprayed corrosion resistant film, the anchoring effect becomes weaker and the sticking material can easily come off the surface and become free particulate matter.

The desired mean crystal particle size described above can be obtained by applying heat treatment after the thermal spraying. The heat treatment activates the grains on the interface so as to grow and fill in the gaps between the grains, thus making the thermally sprayed film denser. Activation of the grains also proceeds in the fine cracks of the grains, thereby filling the cracks and making the film denser.

The thermally sprayed corrosion resistant film is made of a compound of the group 3 element as the main component, and contains from 0.001 to 3% by weight on oxide basis of at least one of Ti, Al and Si. This is because it is preferable to apply the heat treatment at a low temperature in consideration of the probable decrease in bonding strength due to the difference in thermal expansion coefficient between the base material and the thermally sprayed corrosion resistant film, and it is, necessary to improve the sintering performance of the thermally sprayed corrosion resistant film. Ti, Al and Si have the effect of improving the sintering performance of the compound of the group 3 element $Y_2O_3$ and oxide of rare earth element used as the thermally sprayed corrosion resistant film. When $Y_2O_3$ containing 1% by weight of Ti on $TiO_2$ basis is sintered, for example, this material can be made dense at a temperature about 100° C. lower than the temperature required to mike $Y_2O_3$ that does not contain Ti dense. Therefore, it is important to contain at least one of Ti, Al and Si in order to carry out the heat treatment of the present invention at a lower temperature.

Content of at least one of Ti, Al and Si is set in the range from 0.001 to 3% by, weight on oxide basis, because a content less than 0.001% by weight cannot achieve the effect of improving the sintering performance of the thermally sprayed corrosion resistant film, while a content higher than 3% by weight leads to such a low purity of the thermally sprayed corrosion resistant film that decreases the corrosion resistance thereof. Content of at least one of Ti, Al and Si is more preferably in a range from 0.001 to 1% by weight, when corrosion resistance of the thermally sprayed corrosion resistant film against corrosive halogen gas and plasma thereof is taken into consideration.

Content of Ti, Al or Si in the thermally sprayed corrosion resistant film is measured by cutting a piece from the thermally sprayed corrosion resistant film, crushing the piece and analyzing it by an ICP emission spectroscopy analyzer.

The thermally sprayed corrosion resistant film of the present invention is preferably formed mainly from a compound of the group 3 element of the periodic table such as yttrium, lanthanum, cerium or ytterbium. Among these, a material that contains $Y_2O_3$ as the main component has particularly high corrosion resistance against the corrosive gas and plasma thereof. Members of the semiconductor manufacturing equipment having higher corrosion resistance and longer service life can be made by using this material.

The thermally sprayed corrosion resistant film is formed from a compound of the group 3 element, particularly $Y_2O_3$ as the main component for the following reason. When the corrosion resistant film is formed from $Y_2O_3$ on the base material, $YF_3$ is mainly formed through reaction of $Y_2O_3$ and a fluorine-containing gas, and $YCl_3$ is formed through reaction of $Y_2O_3$ and a chlorine-containing gas. Melting points of these reaction products (1152° C. for $YF_3$ and 680° C. for $YCl_3$) are higher than melting points of products formed in reactions of quartz or alumina that has conventionally been used as the corrosion resistant material (−90° C. for $SiF_4$, −70° C. for $SiCl_4$, 1040° C. for $AlF_3$ and 178° C. for $AlCl_3$), thus ensuring stable corrosion resistance even when exposed to corrosive gas and plasma thereof. Similar effect can be obtained also from compounds of rare earth elements such as $CeO_2$ and oxide of rare earth elements such as $Y_2O_3$.

The thermally sprayed corrosion resistant film preferably contains Fe in a concentration not higher than 10 ppm on $Fe_2O_3$ basis and Cr in a concentration not higher than 10 ppm on $Cr_2O_3$ basis.

This is because Fe or Cr content higher than 10 ppm in the thermally sprayed corrosion resistant film decreases the corrosion resistance, and compounds of these elements and reaction products thereof cause degradation of product quality in the semiconductor manufacturing processes.

In order to keep the concentration of Fe and Cr in the thermally sprayed corrosion resistant film within 10 ppm on oxide basis, it is necessary to use a high purity material for thermal spraying and control the environment so as to prevent the entry of foreign matter during the thermal spraying. The nozzle and other members of the thermal spraying apparatus are made of copper, or a ceramic material coated with a metal so as to be electrically conductive.

Void ratio of the thermally sprayed corrosion resistant film is preferably not higher than 10%. When the void ratio is higher, surface roughness of the thermally sprayed corrosion resistant film increases, meaning an increase in the surface area exposed to corrosive gas containing fluorine or chlorine or plasma thereof. Void ratio of the thermally sprayed corrosion resistant film is measured by Archimedes method.

Thickness of the thermally sprayed corrosion resistant film is preferably not larger than 500 μm. Forming the film thicker than 500 μm causes a stress larger than the bonding strength of the film with the base material to be generated in the film thus resulting in peel-off of the film, since the thermally sprayed corrosion resistant film is formed by depositing fine particles by thermal spraying and solidifying then.

Arithmetic mean surface roughness (Ra) of the thermally sprayed corrosion resistant film is preferably 5 μm or less. When the surface roughness is more than 5 μm, the large surface roughness of the thermally sprayed corrosion resistant film means an increase in the surface area exposed to corrosive gas containing fluorine or chlorine or plasma thereof, thus resulting in lower corrosion resistance of the thermally sprayed corrosion resistant film. The surface roughness is measured by means of a commercially available surface roughness meter in terms of arithmetic mean surface roughness (Ra). It is more preferable that surface roughness (Ra) is 5 μm or less and the mean peak-to-peak distance (Sm) is smaller.

In order to set the void ratio of the thermally sprayed corrosion resistant film to 10% or lower, thickness to 500 μm or less and surface roughness (Ra) to 5 μm or less, it is important to completely melt the material to be thermally sprayed so as not to leave any particles unmolten. Presence of a particle that is not melted makes a start point for a void to form, and the size of unmolten particle translates into poor surface roughness. Film thickness can be controlled by repeating the thermal spraying operation a required number of times.

As described previously, the film formed by the thermal spraying method is not dense though. The thermally sprayed corrosion resistant film obtained by applying a heat treatment to the thermally sprayed film has become denser through the growth of grains and shows stable corrosion resistance, although voids and fine cracks formed in the thermally sprayed film are not completely eliminated and remain in the thermally sprayed corrosion resistant film. Despite the fact that the voids and fine cracks that cause a decrease in corrosion resistance are not completely eliminated and remain in the thermally sprayed corrosion resistant film, the thermal spraying method is employed because there is not other method that enables it to form a thick film at a low cost. Thickness of a film that can be formed at a low cost by CVD method or the like is about 5 μm at most. The thermal spray method, in contrast, enables it to form a film having thickness of up to about 1 mm at a low cost, and further thicker films can also be formed.

Now the method of forming the thermally sprayed corrosion resistant film will be described.

There are many variations of the thermal spray method such as reduced pressure plasma thermal spray method, atmospheric pressure plasma thermal spray method, flame, thermal spray method, are thermal spray method and laser thermal spray method. Among these, atmospheric pressure plasma thermal spray method is preferably employed for its capability to use a high temperature heat source for melting a material of high melting point and capability to form a corrosion resistant film at a cost lower than those with other thermal spray methods.

First, a powder of a compound of the group 3 element such as $Y_2O_3$ that makes the thermally sprayed corrosion resistant film is melted by the thermal spray apparatus. For the powder of a compound of the group 3 element that is used in thermal spraying, primary material having a mean crystal particle size from 0.5 to 10 μm is used. Mean crystal particle size of the primary material is set in the range from 0.5 to 10 μm, because use of a powder having a mean crystal particle size smaller than 0.5 μm leads to an increase in the material cost, and use of powder having particle size larger than 10 μm makes it difficult to sinter during the seat treatment.

A powder of oxide of at least one of Ti, Al and Si having particle size of about 1 μm is added in a proportion of 1% by weight or less to the powder of a compound of the group 3 element. This enables it to decrease the temperature of the heat treatment applied after forming the corrosion resistant film by thermal spraying, so that the corrosion resistant film can be prevented from peeling off due to the difference in thermal expansion coefficient between the corrosion resistant film and the base material.

Then the primary material, prepared by adding the powder of oxide of at least one of Ti, Al and Si in a proportion in a range from 0.001 to 3% by weight to the powder of a compound of the group 3 element, is granulated by means of common rolling granulation method or the like, to make the material to be thermally sprayed having a mean particle size in a range from 10 to 50 μm. The primary material powder of the compound of the group 3 element has purity of 99% or higher, which enables it to form the thermally sprayed corrosion resistant film that contains less impurity such as Fe and Cr, 10 ppm or less Fe on $Fe_2O_3$ basis and 10 ppm or less Cr on $Cr_2O_3$ basis. Purity of the primary material powder is more preferably 99.9% or higher.

Mean particle size of the material to be thermally sprayed is set in a range from 10 to 50 μm because particles smaller than 10 μm are too light in weight and would be scattered by the plasma surface when the material is charged and satisfactory thermal spraying cannot be achieved, and particles larger than 50 μm take a long time to melt in the plasma and may remain without melting.

The material to be thermally sprayed is then charged into the atmospheric pressure plasma thermal spray apparatus through a powder charging port, and is heated to a temperature of several thousands to several tens of thousands degrees by the plasma so as to melt. A mixed gas of argon and hydrogen is used to inject the material for thermal spraying. The material to be thermally sprayed is injected toward the base material while injecting the gas at the same time. Output power of the apparatus is controlled while supplying mainly argon gas while adding hydrogen gas to it. It is preferable to set the output power to around 40 kW, and the distance between the base material and the injection port of the thermal spray apparatus is set to around 100 m. While the spray nozzle is moved 2-dimensionally in order to form the thermally sprayed film uniformly over the base material surface while maintaining the distance between the nozzle and the base material constant, the nozzle is moved, for example, at a speed of 30 m/min. in the horizontal direction at vertical intervals of 5 mm.

The thermally sprayed corrosion resistant film formed as described above tends to reflect the mean particle size of the primary material that is used, so as to have mean crystal particle size in the range from 0.5 to 10 μm and contain the oxide of at least one of Ti, Al and Si in a proportion in a range from 0.001 to 3% by weight that was added to decrease the temperature of heat treatment.

Film thickness can be controlled by repeating the thermal spraying operation a required number of times. Film thickness within 500 μm can be achieved by controlling in this way.

The thermally sprayed film formed on the base material to the predetermined thickness is then subjected to a heat treatment. The heat treatment may be conducted in air atmosphere provided that the requirement for temperature is satisfied, which is in a range from 1000 to 1400° C. The heat treatment temperature is set in the range from 1000 to 1400° C., because it is difficult to activate the grains on the interface so as to grow and make the thermally sprayed film denser when the temperature is lower than 1000° C., and the thermally sprayed film comes off due to the difference in thermal expansion coefficient from the base material although it becomes denser when the temperature is higher than 1400° C.

The rate of raising the temperature in the heat treatment process is preferably in a range from 0.5 to 4° C./min. When heated at a rate lower than 0.5° C./min, the thermally sprayed film can be made dense but the production efficiency is unsatisfactorily low. When heated at a rate higher than 4° C./min, the thermally sprayed film is made denser so rapidly that the corrosion resistant film is cracked due to the difference in thermal expansion coefficient and, in the worst case, the corrosion resistant film may peel off. By applying the heat treatment in this way, the corrosion resistant film having void ratio not higher than 10% and surface roughness not more than 5 μm can be formed.

Since thickness of the corrosion resistant film can be easily increased and surface roughness of the film can be increased in the thermal spraying operation, it can hold particles generated inside onto the surface when the film is used in the chamber of semiconductor manufacturing equipment or liquid crystal manufacturing equipment. However, since the material consisting of particles is melted, sprayed onto the base material and quenched so as to form the films one on another in this manufacturing method, gaps are inevitably generated between the melted particles that have deposited, allowing the corrosive gas to enter through the gaps. The PVD corrosion resistant film is the corrosion resistant film without gaps. Although the PVD corrosion resistant film cannot be formed with a large thickness, it can be formed with a higher density. The PVD corrosion resistant film can be used particularly preferably as the member disposed around a wafer in the semiconductor manufacturing equipment. A corrosion resistant member having high corrosion resistance can be made by coating the base material surface only with PVD corrosion resistant film having higher resistance against the plasma of corrosive gas.

Embodiment 3

Last, the third embodiment of the present invention will be described, which is a corrosion resistant member made by forming a plurality of corrosion resistant films on a base material, wherein the corrosion resistant coating consists of a thermally sprayed corrosion resistant film that is formed from a compound of the group 3 element as the main component, contains 0.01 to 3% by weight on oxide basis of at least one of Ti, Al and Si and has a mean crystal particle size in the range from 0.5 to 10 μm, and PVD corrosion resistant film formed from a compound of the group 3 element as the main component and has the ratio $I_{400}/I_{222}$ of peak intensity $I_{400}$ assignable to (400) plane to peak intensity $I_{222}$ assignable to (222) plane of X-ray diffraction being 0.5 or less.

Combination of the thermally sprayed corrosion resistant film and the PVD corrosion resistant film may consist of two or more layers. In the case of 2-layer combination, it can be formed in either of two types: the thermally sprayed corrosion resistant film and the PVD corrosion resistant film formed in this order on the base material; and the DVD corrosion resistant film and the thermally sprayed corrosion resistant film formed in this order on the base material. Additional thermally sprayed corrosion resistant film and PVD corrosion resistant film are formed in the case of constitution comprising more than two layers.

Figure 3A:
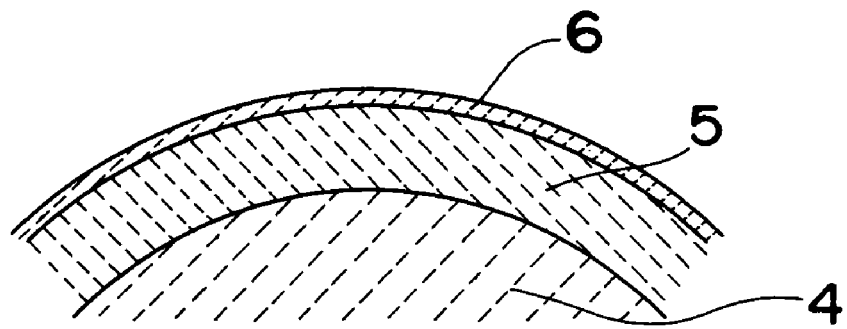
FIG. 3A through FIG. 3C is partial sectional views showing various embodiments of the corrosion resistant member of the present invention.
Figure 3B:
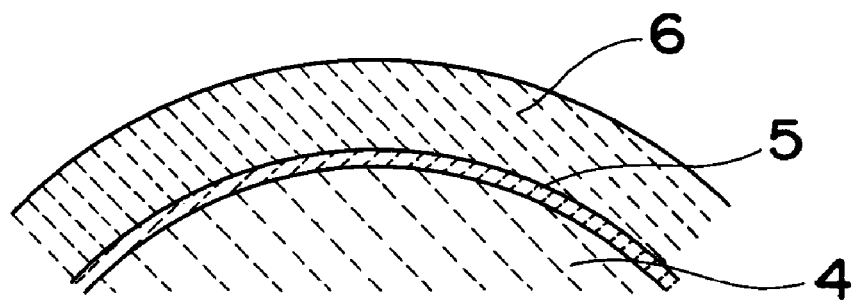
Figure 3C:
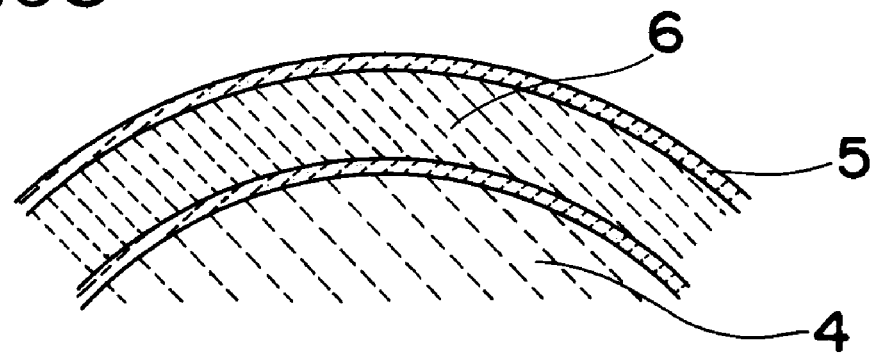

The corrosion resistant member is shown in partial sectional view as made by forming the thermally sprayed corrosion resistant film on the base material and then forming the PVD corrosion resistant film thereon in FIG. 3A, by forming the PVD corrosion resistant film on the base material and then forming the thermally sprayed corrosion resistant film thereon in FIG. 3B, and by forming the PVD corrosion resistant film on the base material and then forming the thermally sprayed corrosion resistant film and the PVD corrosion resistant film thereon in FIG. 3C.

The corrosion resistant member shown in FIG. 3A is made by applying a heat treatment to a film formed by the thermal spraying process on the surface of a base material 4 so as to form a thermally sprayed corrosion resistant film 6, and a forming PVD corrosion resistant film 5 by the PVD method. The corrosion resistant member has excellent corrosion resistance since the dense PVD corrosion resistant film 5 that is free of fine cracks or gaps within the film is formed so as to prevent the corrosive gas from infiltrating through the voids that remain in the thermally sprayed corrosion resistant film 6 and the fine cracks.

The corrosion resistant member shown in FIG. 3B is made by forming the dense PVD corrosion resistant film 5 on the surface of the base material 1 by the PVD method, and applying a heat treatment to a film formed by the thermal spraying process on the surface of base material 4 so as to form the thermally sprayed corrosion resistant film 6. Even when the corrosive gas infiltrates through the voids and the fine cracks of the thermally sprayed corrosion resistant film 3 wherein the voids and the fine cracks are reduced by promoting the growth of the particles by heat treatment, the base material 4 is not corroded by the corrosive gas since the base material 4 is covered by the dense PVD corrosion resistant film 5. In the film forming process of semiconductor manufacturing, evaporation component of the film sticks onto the inner wall member of the semiconductor manufacturing equipment, and the sticking component falls off to generate particles. Anchoring effect of the surface of the thermally sprayed corrosion resistant film 6 prevents the evaporation component of the film that sticks onto the inner wall member from falling off.

The reason for forming the corrosion resistant member having the constitution of the film shown in FIG. 3A and FIG. 3B is that there are two forms of corrosion for the member of the semiconductor manufacturing equipment. One is the corrosion of, for example, the chamber and the microwave introducing window that proceeds relatively slowly. Since these members are located away from the plasma source and are not likely to be exposed directly to the plasma, corrosion resistance against only the corrosive gas is required. In this portion, it preferable to form the thermally sprayed corrosion resistant film 6 on the surface exposed to the corrosive gas in as shown in FIG. 3B. Since the thermally sprayed corrosion resistant film 6 is less dense that the PVD corrosion resistant film 5, the corrosive gas enters into the film but is shut out by the PVD corrosion resistant film formed on the base material. Also because the thermally sprayed corrosion resistant film 6 has a rough surface, the evaporation material of the film can be caused to firmly stick onto the inner wall member and prevented from falling off and generating particles. When the thermally sprayed corrosion resistant film 6 has deteriorated on the surface, it is not necessary to replace the whole member including the base material and, instead, the thermally sprayed corrosion resistant film 6 may be formed over again, thus providing the long-life and low-cost corrosion resistant member.

Second form of corrosion is the rapid corrosion of, for example, the shower head, focus ring, shield ring and the susceptor, that are likely to be exposed directly to the plasma of corrosive gas and require durability to such attacks. In this portion, it preferable to form the PVD corrosion resistant film 5 on the surface which is directly exposed to the plasma as shown in FIG. 1A. The PVD corrosion resistant film 5 is made sufficiently dense, and is less likely to be corroded even when exposed to the plasma, thus ensuring service life of a certain length. Even when the PVD corrosion resistant film 5 is lost through corrosion, it may be formed again on the exposed thermally sprayed corrosion resistant film 6. Thus it is not necessary to replace the whole member including the base material, providing an advantage with regard to the cost.

The third embodiment provides the corrosion resistant member of longer service life than the first and second embodiments, due to the constitution of the film consisting of two or more layers.

Constitution shown in FIG. 3C provides higher corrosion resistance than those shown in FIG. 3A and FIG. 3B. Constitutions shown in FIG. 3A, FIG. 3B and FIG. 3C may be selected according to the form of corrosion encountered in the semiconductor manufacturing equipment. The corrosion resistant member of the present invention provides higher corrosion resistance than the prior art and an advantage with regard to the cost.

In the corrosion resistant member constituted from the combination of the thermally sprayed corrosion resistant film 6 and the PVD corrosion resistant film 5 shown in FIG. 3A, FIG. 3B and FIG. 3C, the thermally sprayed corrosion resistant film 6 can be used without applying heat treatment so as to make denser.

The Miller indices can be determined from the result of X-ray diffraction analysis and the JCPDS card.

Surface roughness (Ra) of the base material 4 whereon the PVD corrosion resistant film 5 and the thermally sprayed corrosion resistant film 6 are formed is preferably 1 μm or larger in case the thermally sprayed corrosion resistant film 6 is formed on the base material 4 as shown in FIG. 3A, in order to provide the anchoring effect for firmly holding the molten particles on the rough surface of the base material.

In case the dense PVD corrosion resistant film 5 is formed on the base material 4 as shown in FIG. 3B or FIG. 3C, surface roughness (Ra) of the base material 4 is preferably less than 1 μm. Since the material deposited by the PVD method shows a behavior on the atomic level, smooth surface of the PVD corrosion resistant film 5 can be formed in conformity with the surface of the base material. Further smoother surface of the corrosion resistant film is obtained by forming another thermally sprayed corrosion resistant film 6 on the PVD corrosion resistant film 5 and thermally sprayed corrosion resistant film 5 thereon.

When forming the PVD corrosion resistant film 5, surface roughness of the base material 4 is preferably less than 1 μm in order to achieve high corrosion resistance, as described previously. In case preference is given to bonding strength with the base material 4 rather than corrosion resistance, however, the PVD corrosion resistant film 5 may be formed on a relatively rough surface of the base material 4 with surface roughness of 1 μm or larger.

The corrosion resistant member of the present invention is not restricted to the embodiments described above, and various modifications can be made without departing from the sprit of the present invention.

EXAMPLE 1

An example of forming the PVD corrosion resistant film on the surface of the base material made of ceramics according to the first embodiment of the present invention will be described.

Figure 4:
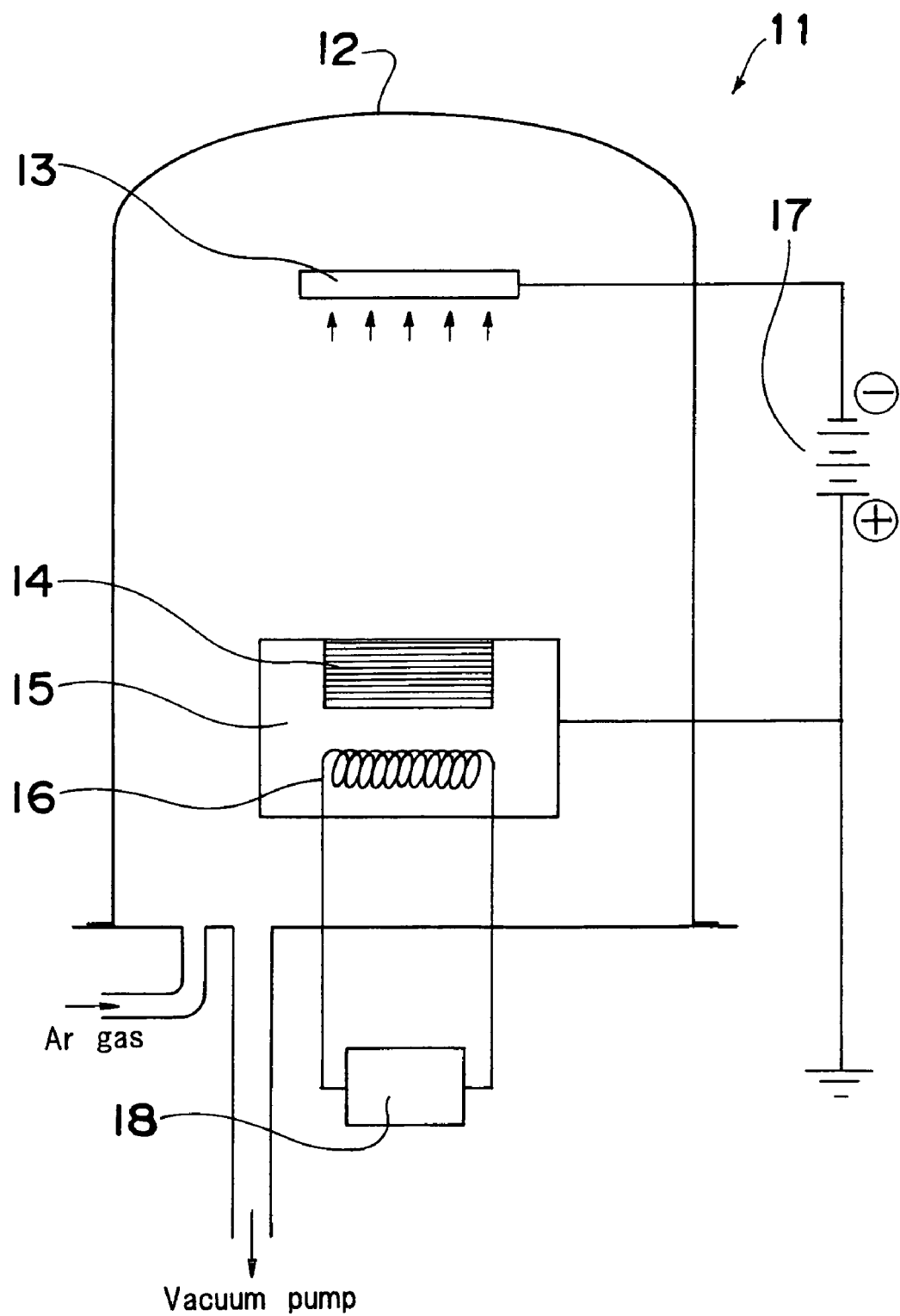
FIG. 4 is a schematic diagram showing the ion plating apparatus used for manufacturing the corrosion resistant member of the present invention.

Corrosion resistant films 10 μm in thickness were formed on the base materials measuring 30 mm in length, 30 mm in width and 2 mm in thickness while varying the value of ratio $I_{400}/I_{222}$ to obtain various states of crystal orientation, by using the ion plating apparatus 11 having the constitution shown in FIG. 4. After forming the films, the films were checked to see whether crack or breakage were caused by the residual stress in the film. Relative density of the film was also measured by X-ray reflectivity method. Peak intensity was measured with a thin film X-ray diffractometer (X'Pert-MRD manufactured by PANalytical) by projecting X-ray at low angles from 1 to 2 degrees.

Base materials made of alumina as ceramics and aluminum or stainless steel as metal were used, which were polished to obtain surface roughness of 1 μm. The alumina had purity of 99% or higher, specific gravity of 3.9 and void ratio not higher than 1%

The corrosion resistant film was formed in the ion plating apparatus 11 shown in FIG. 4 where the base material 4 was set at position 13 and sintered $Y_2O_3$ was charged as the evaporation material 14 and evaporated with plasma generated in the vessel, and yttrium oxide used as the evaporation material was ionized with discharge output power being set to 70% or higher. With a bis voltage applied to the base material that was set at the position 13, ionized yttrium oxide was caused to deposit on the sample to form the film. Value of the ratio $I_{400}/I_{222}$ was controlled to a predetermined value by changing the bias voltage.

In order to evaluate the corrosion resistance, the sample was put in a chamber of a reactive ion etching (RIE) apparatus and high frequency power of 140 W was applied so as to generate plasma in an atmosphere of corrosive gas is consisting of $CF_4$, $CHF_3$, Ar. After holding this state for two hours, volume reduction ratio of the sample was measured to evaluate the corrosion resistance. Volume reduction ratio was calculated as a proportion to the value of the sintered $Y_2O_3$ that was assumed to be 1. A value nearer to 1 indicates better corrosion resistance. In this experiment, a sample was evaluated as having sufficient corrosion resistance when the volume reduction ratio was not higher than 2. Samples showing no cracks and having a volume reduction ratio not higher than 2 were evaluated as "A". Samples showing no cracks but having relatively poor corrosion resistance were evaluated as "B". Samples showing cracks were evaluated as "C".

TABLE 1

| Sample No. | Base material | $I_{400}/I_{222}$ | Properties of corrosion resistant film Relative density (%) | Evaluation | Corrosion resistance |
|---|---|---|---|---|---|
| 1 | Alumina | 0.1 | 69 | B | 2.05 |
| 2 | Alumina | 0.1 | 70 | A | 1.62 |
| 3 | Alumina | 0.1 | 80 | A | 1.43 |
| 4 | Alumina | 0.1 | 90 | A | 1.12 |
| 5 | Alumina | 0.3 | 70 | A | 1.9 |
| 6 | Alumina | 0.3 | 80 | A | 1.53 |
| 7 | Alumina | 0.3 | 90 | A | 1.18 |
| 8 | Alumina | 0.5 | 70 | A | 1.98 |
| 9 | Alumina | 0.5 | 80 | A | 1.59 |
| 10 | Alumina | 0.5 | 90 | A | 1.24 |
| *11 | Alumina | 0.6 | 70 | C | — |
| *12 | Alumina | 0.6 | 80 | C | — |
| *13 | Alumina | 0.6 | 90 | C | — |
| *14 | Alumina | 1.1 | 70 | C | — |
| 15 | Aluminum | 0.1 | 75 | A | 1.65 |
| 16 | Aluminum | 0.3 | 75 | A | 1.71 |
| *17 | Aluminum | 0.5 | 75 | A | 1.73 |
| *18 | Aluminum | 0.6 | 75 | C | — |
| *19 | Aluminum | 1.1 | 75 | C | — |
| 20 | Stainless steel | 0.1 | 75 | A | 1.62 |
| 21 | Stainless steel | 0.3 | 75 | A | 1.69 |
| 22 | Stainless steel | 0.5 | 75 | A | 1.74 |
| *23 | Stainless steel | 0.6 | 75 | C | — |
| *24 | Stainless steel | 1.1 | 75 | C | — |

Marked with * is out of the scope of the present invention.

As shown in Table 1, samples Nos. 11 through 14, 18, 19, 23 and 24 having values of ratio $I_{400}/I_{222}$ higher than 0.5 showed many cracks in the corrosion resistant films that were formed. X-ray diffraction analysis of the surface of the corrosion resistant films showed that peak intensity assignable to (400) plane was higher than peak intensity assignable to (222) plane similarly to the X-ray diffraction chart shown in FIG. 2B, indicating that the crystal was predominantly oriented to (400) plane.

Sample No. 1 showed the value of ratio $I_{400}/I_{222}$ within the range of the present invention, but had a relative density of 69% and showed low corrosion resistance.

In contrast to the samples described above, samples Nos. 1 through 10, 15 through 16 and 20 through 22 showed no cracks or other defects attributable to residual stress existing in the film and demonstrated satisfactory corrosion resistance.

Bonding strength of the film with the base material in the sample No. 3 was 20 gf as measured with a scratch tester.

EXAMPLE 2

Such a PVD corrosion resistant film was formed on the base material made of alumina similar to that of the first embodiment that had a value of the ratio $I_{400}/I_{222}$ exceeding 0.5 and peak intensity assignable to (600) plane and/or peak intensity assignable to (800) plane of X-ray diffraction analysis not larger than 2% of the peak intensity assignable to (222) plane, as another embodiment of the present invention. A corrosion resistant films 10 µm in thickness was formed under conditions similar to those of Example 1 by controlling the ion driving power for the sample (base material) 13 and the evaporation source 15 of the ion plating apparatus by means of the bias voltage.

Evaluation of corrosion resistance using the RIE apparatus similarly to Example 1 showed values of corrosion resistance around 1.5.

Measurement of bonding strength of the corrosion resistant film with the scratch tester similarly to Example 1 showed 15 gf, a value somewhat lower than that of Example 1.

An attempt to form a corrosion resistant film, by setting the distance between the sample 13 and the evaporation source 15 to a value less than one half of that in Example 1, failed to form a satisfactory corrosion resistant film due to crack and breakage.

EXAMPLE 3

Described below is an example where a thermally sprayed corrosion resistant film was formed by applying a heat treatment to a film formed on the base material by thermal spraying method.

Base material measuring 50 min square and 5 mm in thickness was made from alumina having relative density of 95% and purity of 99.5%. Surface roughness of the base material measured with a commercially available surface roughness meter was 5 µm in terms of arithmetic mean roughness Ra (JIS B0601).

The primary material was prepared by adding $TiO_2$, $Al_2O_3$ and $SiO_2$ of various quantities and mean particle sizes shown in Table 1 to he powder of $Y_2O_3$ having particle size of 0.5 µm and purity 99.5%, thereby making the material to be thermally sprayed. The primary material was then granulated by means of rolling granulation method or the like, to make the material having a mean particle size from 10 to 50 µm.

The material to be thermally sprayed was charged into an atmospheric plasma thermal spray apparatus and was melted by plasma and sprayed onto the surface of the base material.

In the plasma thermal spraying, output power was controlled by using argon as the working gas and adding hydrogen gas thereto. Output power was set to 40 kW. Distance between the base material and the injection nozzle of the thermal spray apparatus was set to 100 mm. The spray nozzle was moved back and forth at a speed of 30 m/min. at scanning intervals of 5 mm in order to form the thermally sprayed film uniformly over the base material surface. Material feed rate was set to 30 g/min. Formation of the thermally sprayed film halving thickness of 20 to 50 µm was repeated to place the layers one on another by running the thermal spraying apparatus described above, thereby to form the thermally sprayed film having thickness of 500 µm over the base material.

The sample made by forming the thermally sprayed film of $Y_2O_3$ on he base material in the thermal spraying process was fired at a temperature from 1000 to 1400° C. in air atmosphere by using a commercially available air atmosphere furnace, thereby to obtain the thermally sprayed corrosion resistant film. The contents of $TiO_2$, $Al_2O_3$ and $SiO_2$ in the thermally sprayed corrosion resistant film were measured with the TCP emission spectroscopy analyzer.

The rate of raising the temperature in the heat treatment was set to 2.5° C./min.

Specific gravity of the thermally sprayed corrosion resistant film of each sample was measured by the X-ray reflectivity method. In order to evaluate the corrosion resistance of the thermally sprayed corrosion resistant film, the sample was put in a chamber of a reactive ion etching (RIE) apparatus and high frequency power of 140 W was applied so as to generate plasma in an atmosphere of corrosive gas consisting of a mixture of $CF_4$, $CHF_3$ and Ar. After holding this state for a certain period of time, volume reduction ratio of the sample was measured to evaluate the corrosion resistance. Level of corrosion resistance given in the table is calculated in proportion to the volume reduction ratio of sintered $Y_2O_3$ which is set to 1. A value nearer to 1 indicates better corrosion resistance. A sample was evaluated as having sufficient corrosion resistance when the volume loss was not higher than 2. The volume reduction ratio is the weight loss determined by measuring the weight of the sample before and after measuring the corrosion resistance divided by the density of the sample.

The results are shown in Table 2.

TABLE 2

| Sample No. | Additives in thermally sprayed corrosion resistant film | | Mean particle size of thermally sprayed corrosion resistant film (µm) | Specific gravity | Corrosion resistance |
|---|---|---|---|---|---|
| | Additive | Concentration (% by weight) | | | |
| *1 | $TiO_2$ | 0.0009 | 1.0 | 4.65 | 1.25 |
| 2 | $TiO_2$ | 0.001 | 1.0 | 4.70 | 1.03 |
| 3 | $TiO_2$ | 0.01 | 1.0 | 4.72 | 1.05 |
| 4 | $TiO_2$ | 0.1 | 1.0 | 4.78 | 1.07 |
| *5 | $TiO_2$ | 1.0 | 0.2 | 4.79 | 2.08 |
| 6 | $TiO_2$ | 1.0 | 0.5 | 4.80 | 1.58 |
| 7 | $TiO_2$ | 1.0 | 1.0 | 4.82 | 1.15 |
| 8 | $TiO_2$ | 1.0 | 10.0 | 4.85 | 1.78 |
| *9 | $TiO_2$ | 1.0 | 11.0 | 4.87 | 2.14 |
| 10 | $TiO_2$ | 2.5 | 1.0 | 4.89 | 1.75 |
| 11 | $TiO_2$ | 5.0 | 1.0 | 4.92 | 1.92 |
| *12 | $TiO_2$ | 6.0 | 1.0 | 4.95 | 2.32 |
| *13 | $Al_2O_3$ | 0.0009 | 1.0 | 4.62 | 1.28 |
| 14 | $Al_2O_3$ | 0.001 | 1.0 | 4.70 | 1.01 |
| 15 | $Al_2O_3$ | 0.01 | 1.0 | 4.72 | 1.02 |
| 16 | $Al_2O_3$ | 0.1 | 1.0 | 4.75 | 1.05 |
| *17 | $Al_2O_3$ | 1.0 | 0.2 | 4.76 | 2.05 |
| 18 | $Al_2O_3$ | 1.0 | 0.5 | 4.77 | 1.48 |
| 19 | $Al_2O_3$ | 1.0 | 1.0 | 4.78 | 1.10 |
| 20 | $Al_2O_3$ | 1.0 | 1.0 | 4.82 | 1.15 |
| 21 | $Al_2O_3$ | 1.0 | 10.0 | 4.83 | 1.82 |
| *22 | $Al_2O_3$ | 1.0 | 11.0 | 4.84 | 2.00 |
| 24 | $Al_2O_3$ | 2.5 | 1.0 | 4.82 | 1.52 |
| 25 | $Al_2O_3$ | 5.0 | 1.0 | 4.85 | 1.85 |
| *26 | $Al_2O_3$ | 6.0 | 1.0 | 4.89 | 2.23 |
| *27 | $SiO_2$ | 0.0009 | 1.0 | 4.60 | 1.34 |
| 28 | $SiO_2$ | 0.001 | 1.0 | 4.69 | 1.07 |
| 29 | $SiO_2$ | 0.01 | 1.0 | 4.71 | 1.05 |
| 30 | $SiO_2$ | 0.1 | 1.0 | 4.79 | 1.10 |
| *31 | $SiO_2$ | 1.0 | 0.2 | 4.80 | 2.10 |
| 32 | $SiO_2$ | 1.0 | 0.5 | 4.82 | 1.55 |
| 33 | $SiO_2$ | 1.0 | 1.0 | 4.83 | 1.25 |

TABLE 2-continued

| Sample No. | Additives in thermally sprayed corrosion resistant film | | Mean particle size of thermally sprayed corrosion resistant film (μm) | Specific gravity | Corrosion resistance |
|---|---|---|---|---|---|
| | Additive | Concentration (% by weight) | | | |
| 34 | $SiO_2$ | 1.0 | 1.0 | 4.82 | 1.15 |
| 35 | $SiO_2$ | 1.0 | 10.0 | 4.84 | 1.79 |
| *36 | $SiO_2$ | 1.0 | 11.0 | 4.86 | 2.07 |
| 37 | $SiO_2$ | 2.5 | 1.0 | 4.90 | 1.80 |
| 38 | $SiO_2$ | 5.0 | 1.0 | 4.93 | 1.95 |
| *39 | $SiO_2$ | 6.0 | 1.0 | 4.97 | 2.52 |

Marked with * is out of the scope of the present invention.

Table 2 shows that samples Nos. 1, 13 and 27 have low specific gravity of the thermally sprayed corrosion resistant film in a range from 4.6 to 4.65 due to small contents of $TiO_2$, $Al_2O_3$ and $SiO_2$ added, and are not made sufficiently dense.

Samples Nos. 12, 26 and 39 show low corrosion resistance high contents $TiO_2$, $Al_2O_3$ and $SiO_2$ added.

In samples Nos. 5, 17 and 31, grains of the film have not grown sufficiently and the thermally sprayed corrosion resistant film has small mean crystal particle size and therefore has not made sufficiently denser, thus resulting in poor corrosion resistance. Samples Nos. 9, 22 and 36 have large mean crystal particle size of the thermally sprayed corrosion resistant film, resulting in significant surface roughness of the film that increases the surface area exposed to the corrosive gas and plasma thereof and accordingly poor corrosion resistance.

Samples Nos. 2 through 4, 6 through 8, 10, 11, 14 through 16, 18 through 21, 24, 25, 28 through 30, 32 through 35, 37 and 38, in contrast, contain from 0.001 to 3% by weight of Ti, Al and Si on oxide basis and mean crystal particle size in a range from 0.5 to 10 μm, and showed satisfactory corrosion resistance.

EXAMPLE 4

Then a test was conducted to determine the influence of the contents of Fe and Cr in the thermally sprayed corrosion resistant film on the corrosion resistance.

First a primary material having Ti content comparable to that of sample No. 7 of Example 3 was prepared, and $Fe_2O_3$ and $Cr_2O_3$ powders were added to the primary material in concentrations of 10 ppm and 20 ppm, respectively. This material was melted and sprayed onto the surface of a base material similar to that Example 1 under similar thermal spraying condition, and similar heat treatment was applied thereby to form the thermally sprayed corrosion resistant film. In order to evaluate the corrosion resistance of the thermally sprayed corrosion resistant film, the sample was put in a chamber of a reactive ion etching (RIE) apparatus and high frequency power of 140 W was applied so as to generate plasma in an atmosphere of corrosive gas consisting of $CF_4$, $CHF_3$, Ar. After holding this state for a certain period of time, volume reduction ratio of the sample was measured to evaluate the corrosion resistance. Volume reduction ratio was calculated as a proportion to the volume reduction ratio of the sintered $Y_2O_3$ which was set to 1.

The results are shown in Table 3. The contents of Fe and Cr given in the table were measured on part of the thermally sprayed corrosion resistant film that was formed, by means of inductively coupled plasma (ICP) emission spectroscopy analyzer (SPS1200VR manufactured by Seiko Electronics Inc.).

TABLE 3

| Sample No. | Additives in thermally sprayed corrosion resistant film | | Fe content (ppm) | Cr content (ppm) | Corrosion resistance |
|---|---|---|---|---|---|
| | Additive | Concentration (% by weight) | | | |
| 40 | $TiO_2$ | 1.0 | 10 | 0 | 1.65 |
| 41 | $TiO_2$ | 1.0 | 20 | 0 | 2.28 |
| 42 | $TiO_2$ | 1.0 | 0 | 10 | 1.54 |
| 43 | $TiO_2$ | 1.0 | 0 | 20 | 2.06 |
| 44 | $TiO_2$ | 1.0 | 10 | 10 | 1.78 |
| 45 | $TiO_2$ | 1.0 | 20 | 10 | 2.56 |
| 46 | $TiO_2$ | 1.0 | 10 | 20 | 2.35 |

Marked with * is out of the scope of the present invention.

Table 3 shows that samples Nos. 41, 43, 45 and 46 that contain Fe and Cr in concentrations higher than 10 ppm have lower corrosion resistance than the samples containing Fe and Cr in concentrations not higher than 10 ppm. Thus it was found that Fe and Cr concentrations in the corrosion resistant member are preferably not higher than 10 ppm.

EXAMPLE 5

Then thermally sprayed films were formed under similar conditions as those of the samples containing $Y_2O_3$ of Example 3, and were fired at temperatures of 900, 1000, 1100, 1200, 1300, 1400 and 1500° C. in air atmosphere by using a commercially available air atmosphere furnace, thereby to obtain the thermally sprayed corrosion resistant film.

Void ratio and surface roughness of each sample were measured, and corrosion resistance of each sample was evaluated using a reactive ion etching (RIE) apparatus similarly to Example 1.

Void ratio was measured by Archimedes method, on the corrosion resistant film of piece that was cut off from the sample made as described previously. Surface roughness was measured with a commercially available surface roughness meter and is given in terms of arithmetic mean roughness Ra (JIS B0601).

The results are shown in Table 4.

TABLE 4

| Sample No. | Particle size of powder (μm) | Heat treatment temperature (° C.) | Mean crystal particle size (μm) | Void ratio of corrosion resistant film (%) | Surface roughness (μm) | Corrosion resistance |
|---|---|---|---|---|---|---|
| 47 | 1 | 900 | 0.5 | 15 | 9 | 1.60 |
| 48 | 1 | 1000 | 0.5 | 10 | 7 | 1.40 |
| 49 | 1 | 1100 | 0.8 | 9 | 6 | 1.12 |
| 50 | 1 | 1200 | 2 | 9 | 6 | 1.10 |
| 51 | 1 | 1300 | 5 | 8 | 5 | 1.05 |
| 52 | 1 | 1400 | 10 | 5 | 3 | 1.03 |
| *53 | 1 | 1500 | 12 | — | — | — |

Marked with * is out of the scope of the present invention.

As will be apparent from Table 4, in sample No. 53 that was subjected to a heat treatment at a high temperature, the thermally sprayed corrosion resistant film peeled off due to the difference in thermal expansion coefficient with the base material, making it impossible to evaluate the void ratio, surface roughness and corrosion resistance.

Sample No. 47 that was subjected to a heat treatment at a low temperature had mean crystal particle size of 0.5 μm but showed high void ratio of 15% indicating that the thermally sprayed corrosion resistant film was not made dense in the surface, and showed significant surface roughness of 9 μm and poor corrosion resistance.

In contrast to the above, samples Nos. 41 through 45 of the present invention that were subjected to a heat treatment at temperatures from 1000 to 1400° C. showed good corrosion resistance. Samples Nos. 51 and 52 of which surface roughness was 5 μm or less showed particularly good results.

EXAMPLE 6

Then among the corrosion resistant members of the present invention, those having the thermally sprayed corrosion resistant film of the present invention that was made by applying a heat treatment to the thermally sprayed film and the PVD corrosion resistant film formed thereon were subjected to evaluation.

First those similar to sample No. 29 were prepared and PVD corrosion resistant film having the constitution shown in FIG. 3A was formed from $Y_2O_3$ on the thermally sprayed corrosion resistant film by ion plating method. The apparatus 11 having the constitution shown in FIG. 4 was used as the ion plating apparatus.

Sample is set at position 13 in FIG. 4. The vacuum vessel is evacuated with a vacuum pump to a pressure of $10^{-3}$ to $2\times10^{-1}$ Torr, and is supplied with argon (Ar) gas. DC voltage of 2 to 5 kV is applied by the plasma generating power source 17 across the sample 13 and the evaporation source 15, so as to effect DC glow discharge of about 0.5 mA/cm$^2$. Then after cleaning the surface of the sample 13 by bombarding it with Ar ions, the evaporation source 15 is heated by energizing the filament 16 with the evaporation power source 18, thereby evaporating the evaporation material 14 made of $Y_2O_3$. Evaporated $Y_2O_3$ is ionized in the plasma, and collides with the sample 13 thereby to form the PVD corrosion resistant film of the present invention.

The thermally sprayed corrosion resistant film formed from $Y_2O_3$ as described above was made denser with a high density of 3.0 g/cm$^3$ as measured by X-ray reflectivity method. X-ray diffraction chart showed a value of the ratio $I_{400}/I_{222}$ of peak intensity $I_{400}$ assignable to (400) plane to peak intensity $I_{222}$ assignable to (222) plane of X-ray diffraction being 0.5 or less. Relative density was 99%.

In order to evaluate the corrosion resistance of the present invention formed as described above, the sample was put in a chamber of a reactive ion etching (RIE) apparatus and high frequency power of 140 W was applied so as to generate plasma in an atmosphere of mixed corrosive gas consisting of $CF_4$, $CHF_3$, Ar. After holding this state for a certain period of time, volume reduction ratio of the sample was measured so as to evaluate the corrosion resistance. Volume reduction ratio was 1.15 in proportion to that of the sintered $Y_2O_3$ which was set to 1, indicating excellent corrosion resistance.

The corrosion resistance was also evaluated for the corrosion resistant member having such a constitution of PVD corrosion resistant film—thermally sprayed corrosion resistant film as the base material made of ceramics with PVD corrosion resistant film formed thereon from $Y_2O_3$ by the method similar to that described above, and the thermally sprayed corrosion resistant film formed thereon. This showed corrosion resistance of 1.24, showing good corrosion resistance although a little lower than that of the constitution of thermally sprayed corrosion resistant film—PVD corrosion resistant film combination.

What is claimed is:

1. A corrosion resistant member comprising:
    a base material including ceramics or a metal and
    at least one layer of corrosion resistant film formed on the surface of said base material,
    wherein at least one layer of said corrosion resistant film in a PVD corrosion resistant film formed from a group 3 element compound as the main component, and said PVD corrosion resistant film has a value of ratio $I_{400}/I_{222}$ of peak intensity $I_{400}$ assignable to (400) plane to peak intensity $I_{222}$ assignable to (222) plane of X-ray diffraction not higher than 0.5.

2. The corrosion resistant member according to claim 1, wherein said PVD corrosion resistant film has a value of ratio $I_{400}/I_{222}$ not higher than 0.1.

3. The corrosion resistant member according to claim 1, wherein said PVD corrosion resistant film is formed from $Y_2O_3$ as the main component.

4. The corrosion resistant member according to claim 1, wherein a content of an inert gas component contained in said PVD corrosion resistant film is not more than 0.1% by volume.

5. The corrosion resistant member according to claim 1, wherein said PVD corrosion resistant film has surface roughness (Ra) of 1 μm or less.

6. The corrosion resistant member according to claim 1, wherein said PVD corrosion resistant film has relative density of 70% or higher.

7. The corrosion resistant member according to claim 1, wherein the mean crystal particle size of said PVD corrosion resistant film is set in a range from 50 nm to 1000 nm.

8. The corrosion resistant member according to claim 1, wherein said base material is made of ceramics containing $Al_2O_3$ as the main component.

* * * * *